(12) United States Patent
Jeon

(10) Patent No.: US 7,759,999 B2
(45) Date of Patent: Jul. 20, 2010

(54) EXTERNALLY ASYNCHRONOUS INTERNALLY CLOCKED SYSTEM

(75) Inventor: Seon-Kwang Jeon, Ichon (KR)

(73) Assignee: Hynix Semiconductor Inc. (KR)

( * ) Notice: Subject to any disclaimer, the term of this patent is extended or adjusted under 35 U.S.C. 154(b) by 37 days.

(21) Appl. No.: 12/177,025

(22) Filed: Jul. 21, 2008

(65) Prior Publication Data

US 2009/0121766 A1      May 14, 2009

(30) Foreign Application Priority Data

Nov. 9, 2007      (KR) ...................... 10-2007-0114141

(51) Int. Cl.
*H03K 3/00*      (2006.01)
(52) U.S. Cl. ...................... 327/291; 327/299; 327/112; 326/82; 326/87
(58) Field of Classification Search ................... None
See application file for complete search history.

(56) References Cited

U.S. PATENT DOCUMENTS

| | | | |
|---|---|---|---|
| 4,704,713 A * | 11/1987 | Haller et al. ................... 398/3 |
| 5,187,686 A * | 2/1993 | Tran et al. ............... 365/189.11 |
| 6,091,260 A * | 7/2000 | Shamarao .................... 326/27 |
| 6,483,354 B1 * | 11/2002 | Gasparik .................... 327/112 |
| 6,573,753 B1 * | 6/2003 | Snyder ....................... 326/87 |
| 6,941,533 B2 | 9/2005 | Andreev et al. |
| 6,977,530 B1 * | 12/2005 | Wang et al. .................... 327/51 |
| 7,116,129 B2 * | 10/2006 | Pan et al. ..................... 326/32 |
| 7,506,234 B2 * | 3/2009 | Lee et al. ..................... 714/732 |
| 2008/0137471 A1 | 6/2008 | Schnell et al. |

FOREIGN PATENT DOCUMENTS

| | | |
|---|---|---|
| JP | 2006-331190 | 12/2006 |
| KR | 1019990057149 | 7/1999 |
| KR | 1020010004327 | 1/2001 |
| KR | 1020040045691 A | 6/2004 |
| KR | 1020050082599 A | 8/2005 |

\* cited by examiner

*Primary Examiner*—An T Luu
(74) *Attorney, Agent, or Firm*—Baker & McKenzie LLP

(57) ABSTRACT

An Externally Asynchronous-Internally Clocked (EAIC) system that generates an internal clock signal includes a clock signal control block. The clock signal control block includes a pull-up unit that is activated in response to an input signal used to generate an internal clock signal; a pull-down unit that is activated in response to the input signal used to generate an internal clock signal, and a bypass unit that is provided between the pull-up unit and the pull-down unit, and selectively provides a signal path to the pull-down unit if the pull-down unit is activated and a signal path from the pull-up unit if the pull-up unit is activated.

24 Claims, 5 Drawing Sheets

EXTERNALLY ASYNCHRONOUS INTERNALLY CLOCKED SYSTEM

CROSS-REFERENCES TO RELATED APPLICATION

This application claims the benefit under 35 U.S.C 119(a) of to Korean application number 10-2007-0114141, filed on Nov. 9, 2007, which is incorporated by reference in its entirety by reference as if set forth in full.

BACKGROUND

1. Technical Field

The embodiments described herein relate to an Externally Asynchronous-Internally Clocked (EAIC) system, and more particularly, to an EAIC system that internally generates a clock signal in an asynchronous system.

2. Related Art

An externally asynchronous-internally clocked (hereinafter, referred to as "EAIC") system, which is operated externally in an asynchronous manner and operated internally on the basis of a clock, has been introduced in recent years for use in conventional semiconductor devices.

FIG. 1 is a conceptual block diagram of a general EAIC system 1. Referring to FIG. 1, an EAIC system 1 includes a first shift register block 2, a next input signal generating block 3, a second shift register block 4, an output buffer 5, a clock signal control block 6, and a clock signal generating block 7. The EAIC system 1 performs synchronous and asynchronous operations at the same time. In conventional EAIC systems, there is only outside visibility to the external input signals "INPUT" and external output signals "OUTPUT". However, that the EAIC system also generates an internal clock "CLK" using an input signal.

Specifically, when an external input signal "INPUT" is supplied to the EAIC system from the outside, signals output from the first shift register block 2 are transmitted to the next input signal generating block 3. The next input signal generating block 3 generates input signals, which are to be sent to the second shift register block 4, using the received signals. The second shift register block 4 receives the signals and provides output signals. Accordingly, the output buffer 5 buffers the signals, which are provided from the first and second shift register blocks 2 and 4, and generates external output signals "OUTPUT". In this case, the signals supplied from the second shift register block 4 are fed back to the next input signal generating block 3, so that new input signals to be sent to the second shift register block 4 may be generated.

Meanwhile, each of the first and second shift register blocks, 2 and 4 of the EAIC system 1, generates a ready signal "R" unlike a general register. That is, the ready signal "R" is a signal indicating that the first and second shift register blocks have completely transmitted a signal to the next circuit block. The clock signal control block 6 performs the logical operation of the ready signal "R". Since the ready signal "R" is generated by the operation of the first and second shift register blocks 2 and 4 with a predetermined small time difference, the clock signal generating block 7 can generate an internal clock "CLK" based on the time difference. However, the clock signal control block 6 generally uses a NOR gate. Due to the structure of the NOR gate, NMOS transistors are connected in parallel and PMOS transistors are connected in series. For this reason, a series signal path of the PMOS transistor is lengthened in accordance with the number of signals to be received. Accordingly, output time may be delayed. That is, a general NOR gate may have restriction on fan-in due to the turn-on time of the PMOS transistors connected in series.

Accordingly, a conventional EAIC system 1 uses a wide NOR gate that is embodied as shown in FIG. 2. The wide NOR gate is a logic embodied so that only input signals of NMOS transistors connected in parallel are activated by substituting the PMOS transistors connected in series with one PMOS transistor. The clock signal control block 6 combines ready signals ("R0"-"R3"; four ready signals are exemplified for convenience of description) generated from the register blocks 2 and 4, and provides an output signal "R_OUT". The clock signal control block 6 includes a PMOS transistor WP1 and first to fourth NMOS transistors NM1 to NM4 that receive the ready signals "R0" to "R3".

The PMOS transistor WP1 includes a source connected to an external power supply voltage VDD, a gate connected to a ground voltage VSS, and a drain connected to a node a. Further, the PMOS transistor WP1 may be a weak PMOS transistor where weak current flows due to a long channel length. The first to fourth NMOS transistors NM1 to NM4 are connected in parallel, and include gates for receiving the first to forth ready signals "R0" to "R3", drains connected to the node a, and sources connected to the ground voltage VSS, respectively.

The operation of the clock signal control block 6 will be described below. The clock signal control block provides an output signal "R_OUT" by the ready signals "R0" to "R3" that are activated with very small time difference. That is, since the ready signals "R0" to "R3" are activated or deactivated with a very small time difference, the clock signal control block 6 sets this as a target operation. Accordingly, the clock signal control block 6 is provided to output a low-level output signal "R_OUT" when all of the ready signals "R0" to "R3" are activated, and to output a high-level output signal "R_OUT" when all of the ready signals "R0" to "R3" are deactivated. For this reason, the NMOS transistors NM1 to NM4 are sequentially turned on by the ready signals "R0" to "R3" that are activated with very small time difference, and provide low-level output signals "R_OUT".

Alternatively, all of the NMOS transistors NM1 to NM4 are turned off by the ready signals "R0" to "R3" that are activated with very small time difference and the PMOS transistor WP1 may provide a high-level output signal "R_OUT". However, even though one NMOS transistor NM1 of several NMOS transistors is turned on, the PMOS transistor WP1 is turned on. Therefore, a direct current path is formed from the external power supply voltage VDD to the ground voltage VSS, so that large current may flow. That is, since the ready signals R0 to R3 are activated, a direct current path is always formed. Accordingly, the response speed can be improved as compared to a general NOR gate. However, since direct current flows, the current consumption may be large.

SUMMARY

An EAIC system having high response speed and low current consumption is described herein.

According to one aspect, an EAIC system can include a clock signal control block. The clock signal control block can include a pull-up unit that can be activated in response to an input signal and used to generate an internal clock signal, a pull-down unit that can be activated in response to the input signal and used to generate an internal clock signal, and a bypass unit that can be provided between the pull-up unit and the pull-down unit and configured to selectively provide a signal path to the pull-down unit if the pull-down unit is activated or a signal path from the pull-up unit if the pull-up unit is activated.

According to another aspect, an EAIC system can include a clock signal control block. The clock signal control block can include a pull-down unit that can be activated in response to an input signal and used to generate an internal clock signal, a bypass unit that can be connected to an output terminal of the pull-down unit, and a pull-up unit that can be deactivated so that a signal path from an external power supply voltage to the bypass unit can be blocked if the pull-down unit is activated.

According to another aspect, an EAIC system can include a pull-up unit that can include a plurality of PMOS transistors which can be activated in response to input signals and used to generate a plurality of internal clock signals, respectively, a pull-down unit that can include a plurality of NMOS transistors that can be activated in response to the input signals used to generate a plurality of internal clock signals, respectively, and a bypass unit that can be provided between the pull-up unit and the pull-down unit. When all of the input signals used to generate a plurality of internal clock signals are activated or deactivated, a current path from the pull-up unit to the pull-down unit can be blocked.

According to another aspect, an EAIC system can include a clock signal control block. The clock signal control block can include a pull-down device that can provide an output signal corresponding to a ground voltage level when being activated in response to an input signal used to generate an internal clock signal, a pull-up device that can provide an output signal corresponding to an external power supply voltage level when being activated in response to the input signal used to generate an internal clock signal, and a bypass device that can be provided between the pull-up device and the pull-down device, and can provide a signal path from an external power supply if the pull-up device is activated, and block a signal path from the ground voltage if the pull-down device is activated.

According to another aspect, an EAIC system can include a clock signal control block. The clock signal control block can include a pull-down unit which can include a plurality of pull-down devices that can provide output signals corresponding to a ground voltage level when being activated in response to input signals used to generate internal clock signals, a pull-up unit which can include a plurality of pull-up devices that can provide an output signal corresponding to an external power supply voltage level when being activated in response to the input signals used to generate internal clock signals; and a bypass unit that can be provided between the pull-up unit and the pull-down unit, and can provide a signal path from an external power supply if the pull-up unit is activated, and can blocks a signal path from the ground voltage if the pull-down unit is activated.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to the embodiment described herein, an EAIC system in which a circuit block can make a response at high speed regardless of the number of input signals activated with a predetermined delay time regardless of fan-in. In addition, a bypass unit is provided between a pull-up unit and a pull-down unit so that a direct current path is not formed. Accordingly, each of the pull-down unit and the pull-up unit can be driven in accordance with input signals. Therefore, it is possible to prevent a direct current path from being always formed from an external power supply voltage to a ground voltage. As a result, it is possible to improve the current consumption during the operation of a circuit of the EAIC system.

Figure 3:
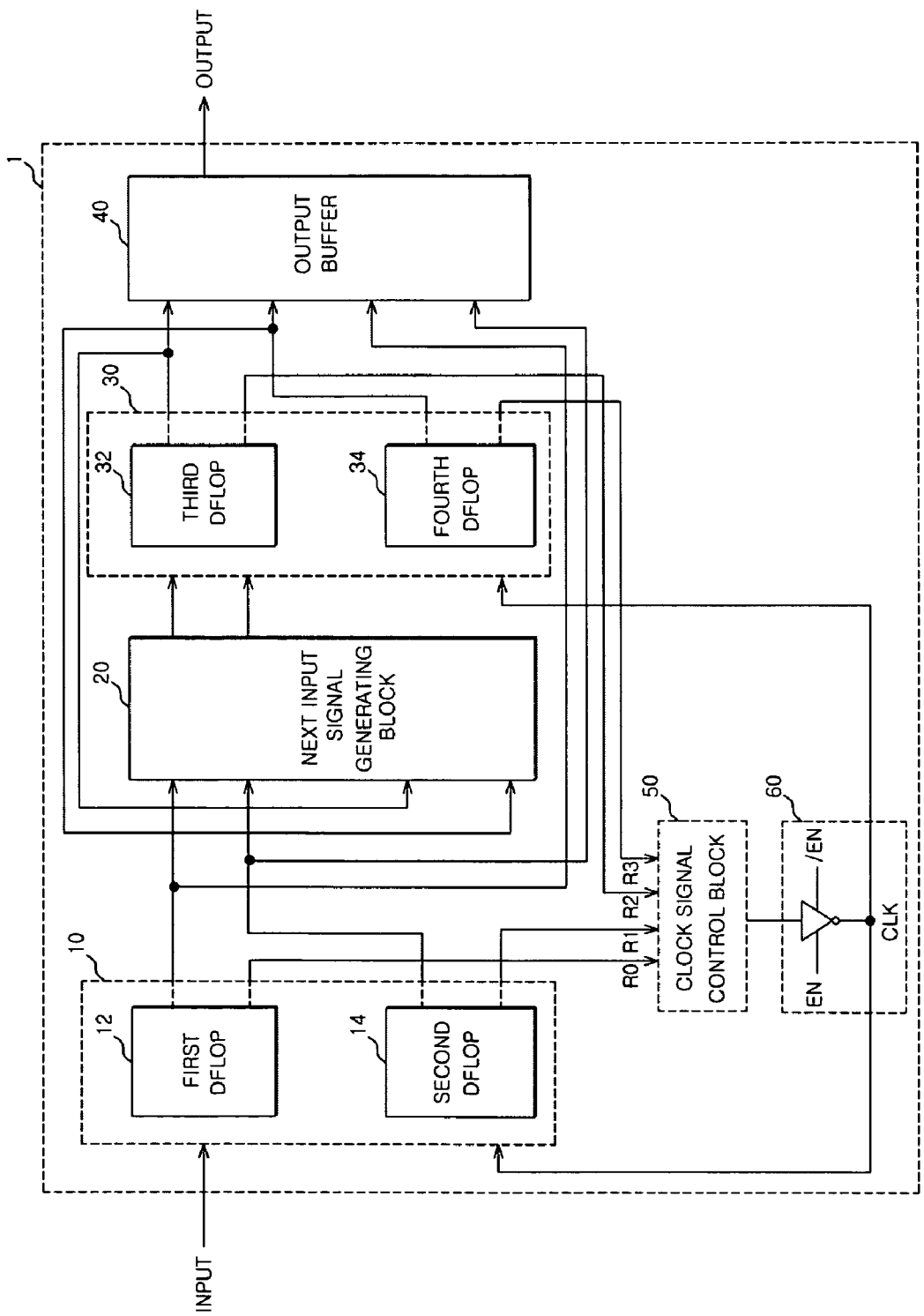
FIG. 3 is a block diagram of an EAIC system according to an embodiment.

FIG. 3 is a schematic block diagram of an EAIC system 100 according to one embodiment herein. Referring to FIG. 3, an EAIC system 100 can include a first shift register block 10, a next input signal generating block 20, a second shift register block 30, an output buffer block 40, a clock signal control block 50, and a clock signal generating block 60.

Specifically, the first shift register block 10 can includes a first DFLOP 12 and a second DFLOP 14. Each of the first and second DFLOPs 12 and 14 can be operated similarly to a general D Flip Flop. However, each of the first and second DFLOPs is different from the general D Flip Flop in that each of the first and second DFLOPs can generate a ready signal R indicating that it is ready to perform a new operation after the completion of an operation for transmitting a signal. Here, the detailed structure of the DFLOP has not been shown, but the DFLOP can includes a metastable detection logic so as to avoid a metastable state of an internal operation. The first DFLOP 12 and the second DFLOP 14 can receive an external input signal "INPUT", and can transmit the external input signal to the next input signal generating block 20. Then, the first DFLOP 12 and the second DFLOP 14 can provide ready signals "R0" and "R1" to the clock signal control block 50.

The next input signal generating block 20 can generate signals, which are to be input to the second shift register block 30, using the signals received from the first DFLOP 12 and the second DFLOP 14. The second shift register block 30 can include third and fourth DFLOPs 32 and 34 like the first shift register block 10. The third DFLOP 32 and the fourth DFLOP 34 can receive the signals provided from the next input signal generating block 20, and can transmit the signals to the output buffer block 40. Then, the third DFLOP 32 and the fourth DFLOP 34 can feed back the signals to the next input signal generating block 20 again.

Accordingly, the next input signal generating block 20 can generate new signals and provide the signals to the second shift register block 30, so that the second shift register block 30 can continue to operate while an input signal is changed. Meanwhile, when signals are completely transmitted to the next circuit block, the third DFLOP 32 and the fourth DFLOP 34 can also provide ready signals "R2" and "R3" to the clock signal control block 50.

The output buffer block 40 may buffer the signals which can be output from the first and second shift register blocks 10 and 30, and can provide the signals as external output signals "OUTPUT".

Each of the first and second shift register blocks 10 and 30 can be a circuit that can be operated in synchronization with a clock, but which does not receive an external clock signal in the EAIC system 100. An internal clock "CLK" can be generated as a signal that can be internally operated, and can be used instead of the external clock signal. Accordingly, the clock signal control block 50 can perform a logical operation for each of the ready signals "R0" to "R3". The clock signal generating block 60 can generate internal clocks "CLK" by the result of the logical operation of the clock signal control block 50, in response to enable signals "EN" and "/EN". Therefore, the EAIC system 100 can be operated by the internal clocks CLK, which can be generated as the ready signals "R0" to "R3", instead of external clock signals. Each of the internal clocks "CLK" can be generated by exactly calculating a delay time of each of the first and second register blocks 10 and 30, so that it is possible to prevent the skew of a clock, and to perform a high-speed operation. Further, while the external input signal "INPUT" is applied, it is possible to infinitely generate the internal clock "CLK".

In particular, the clock signal control block 50, according to one embodiment, can embody a circuit having improved current consumption and high response speed with respect to the ready signals "R0" to "R3", which can be signals used to generate internal clock signals and can be received with a predetermined delay time.

Figure 4:
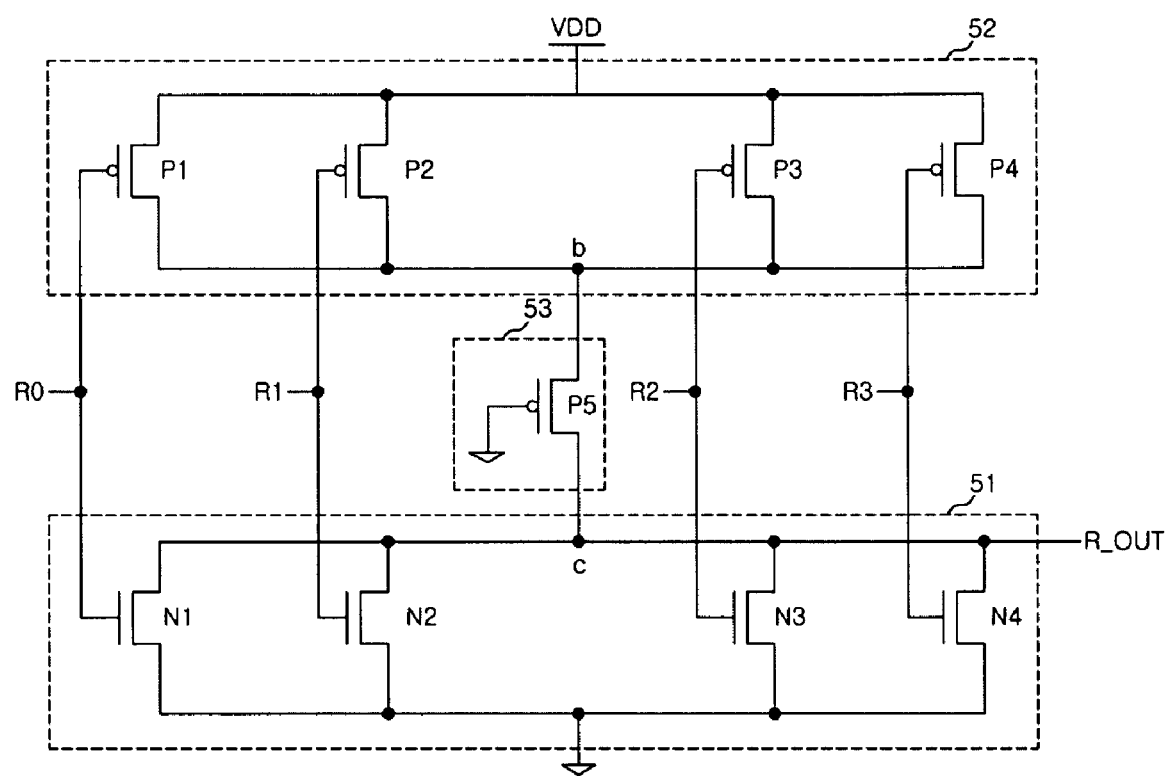
FIG. 4 is a circuit diagram of a clock signal control block that can be included in the circuit illustrated in FIG. 3.

FIG. 4 is a circuit diagram of the clock signal control block 50 according to one embodiment described herein. Referring to FIG. 4, the clock signal control block 50 can combine the first to forth ready signals "R0" to "R3", which are signals, which can be used to generate internal clock signals, which can be used to generate a ready output signal "R_OUT". Even while receiving the activated ready signals "R0" to "R3", the clock signal control block 50 does not form a direct current path from an external power supply voltage VDD to a ground voltage VSS. Therefore, it is possible to reduce current consumption.

The clock signal control block 50 can include a pull-down unit 51, a pull-up unit 52, and a bypass unit 53. When receiving the activated first to forth ready signals "R0" to "R3", the pull-down unit 51 can be turned on and can provide a low-level ready output signal "R_OUT". The pull-down unit 51 can includes first to fourth NMOS transistors N1 to N4.

The first to fourth NMOS transistors N1 to N4 can be connected to one another in parallel, and can include gates configured to receive the first to forth ready signals "R0" to "R3", drains connected to a node c, and sources connected to a ground voltage VSS, respectively.

When receiving the activated first to forth ready signals "R0" to "R3", the pull-up unit 52 can be turned on and can provide a high-level ready output signal "R_OUT". The pull-up unit 52 can include first to fourth PMOS transistors P1 to P4. The first to fourth PMOS transistors P1 to P4 can be connected to one another in parallel, and can include gates for receiving the first to forth ready signals R0 to R3, drains connected to a node c, and sources connected to an external power supply voltage VDD, respectively.

Meanwhile, the bypass unit 53 can include a fifth PMOS transistor P5. The bypass unit 53 can be a weak PMOS transistor where weak current flows due to a long channel length. The fifth PMOS transistor P5 can include a gate connected to the ground voltage VSS, a source connected to a node b, and a drain connected to the node c. Accordingly, the fifth PMOS transistor P5 is always turned on. For this reason, when the pull-up unit 52 is activated, the fifth PMOS transistor can provide a path for a signal that can be transmitted from the pull-up unit 52. When the pull-down unit 51 is activated, the fifth PMOS transistor does not receive an external power supply voltage VDD even though it is turned on. Therefore, the fifth PMOS transistor does not affect the signal output path of the pull-down unit 51.

As described above, unlike a general NOR gate, the pull-up unit 52 is connected in parallel in the clock signal control block 50. Therefore, signal response speed can be improved. In addition, unlike the conventional wide NOR gate, a direct current path is not always formed, therefore the current consumption can be improved. Subsequently, a case where the first to fourth ready signals "R0" to "R3" are activated will be exemplified with reference to FIG. 4.

When the clock signal control block receives the activated high-level first to fourth ready signals "R0" to "R3", the first to fourth NMOS transistors N1 to N4 can be turned on and the first to fourth PMOS transistors P1 to P4 can be turned off. Accordingly, the ready output signal "R_OUT" can becomes a low level. However, even though the bypass unit 53 can be turned on, a direct current path is not formed because the bypass unit is not connected to the external power supply voltage VDD.

In contrast, when the clock signal control block receives the deactivated low-level first to fourth ready signals "R0" to "R3", the first to fourth PMOS transistor P1 to P4 can be turned on and the first to fourth NMOS transistors N1 to N4 can be turned off. Thus, a signal path can be formed from the first to fourth PMOS transistors P1 to P4 via the bypass unit 53. Accordingly, the clock signal control block 50 can generate a high-level ready output signal "R_OUT". Even in this case, a direct current path is not formed. Therefore, when all of the first to fourth ready signals "R0" to "R3" are activated or deactivated, the clock signal control block 50 can block a direct current path from the pull-up unit 52 to the pull-down unit 51.

Figure 1:
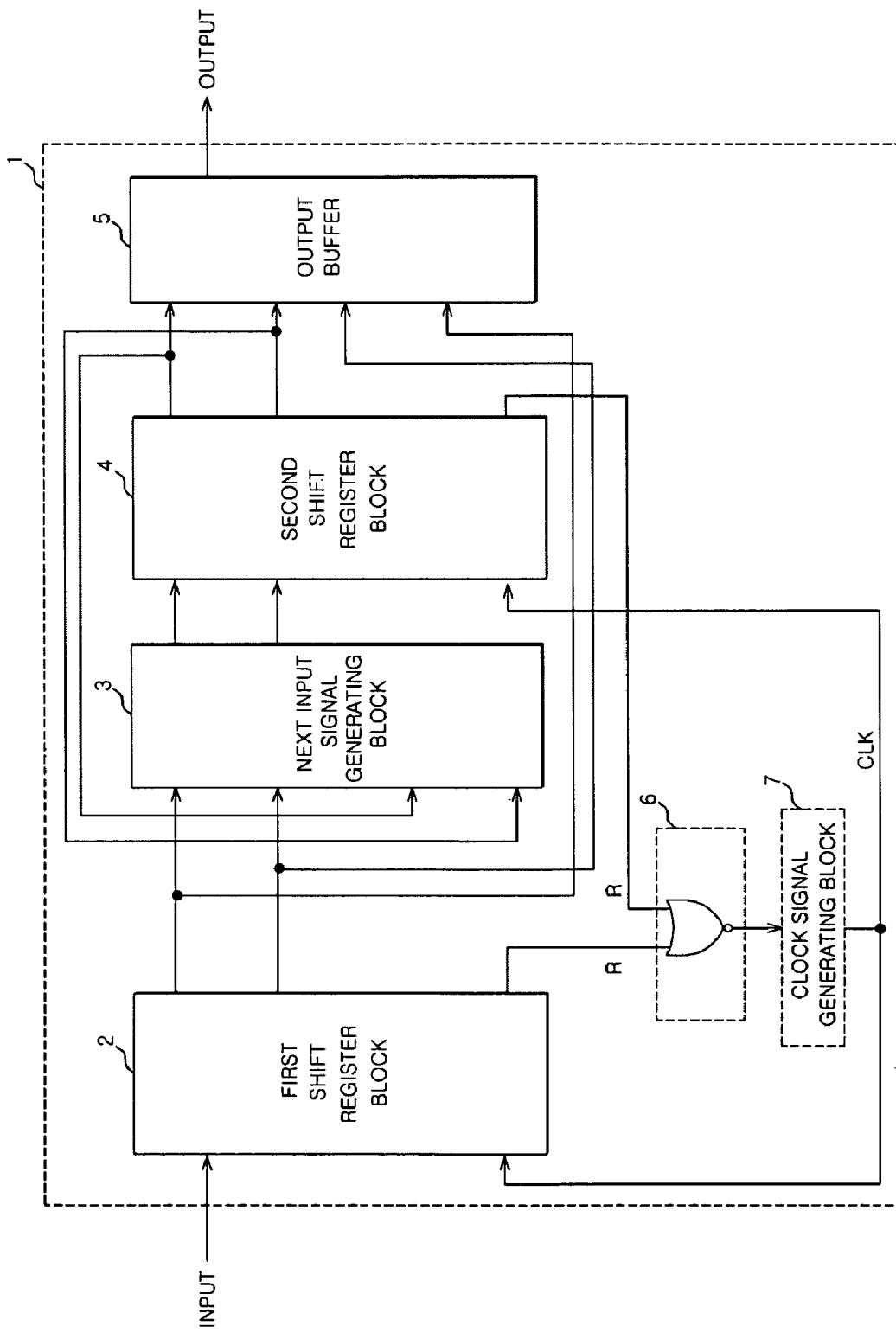
FIG. 1 is a block diagram of an EAIC system in the related art.
Figure 2:
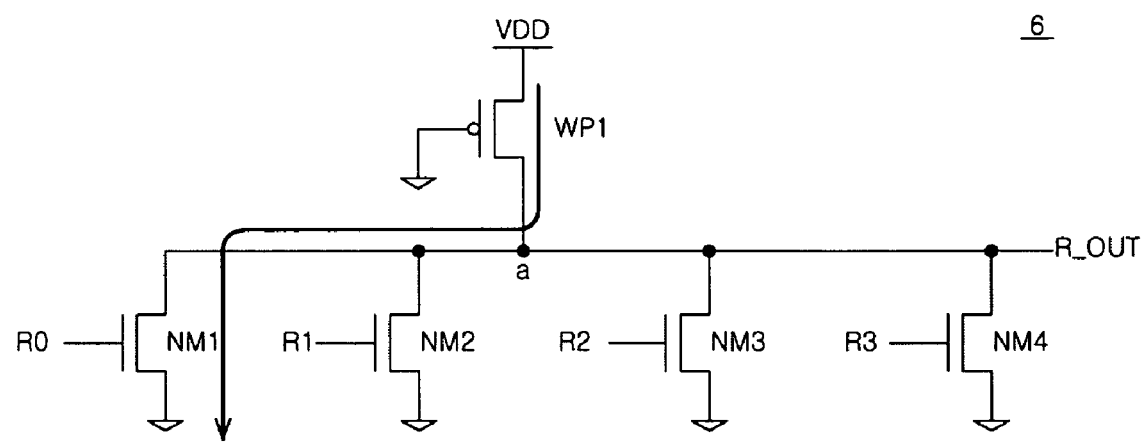
FIG. 2 is a circuit diagram of a clock signal control block of FIG. 1.
Figure 5:
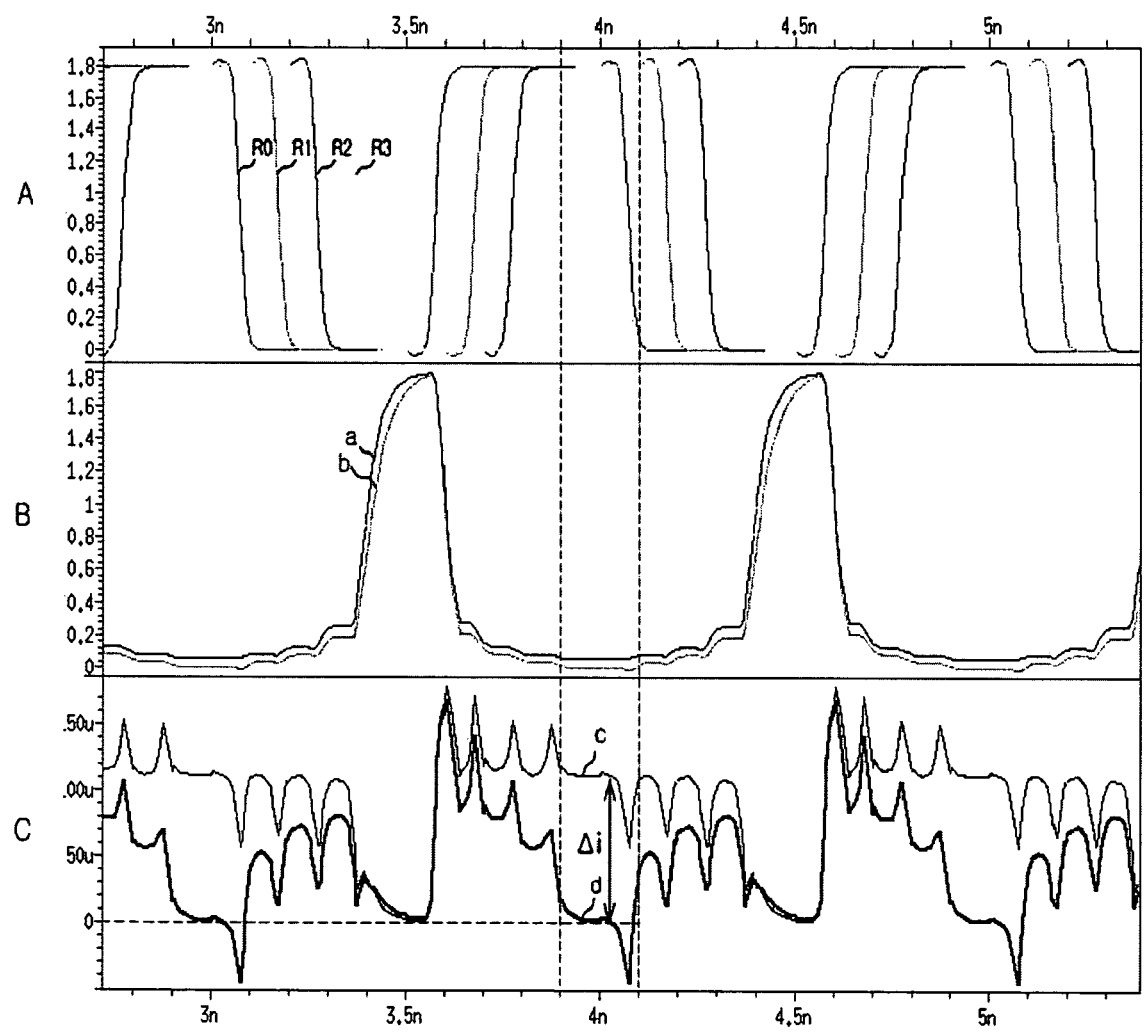
FIG. 5 is a graph showing the simulated waveform of current and an operating voltage of the clock signal control block that can be included in the circuit illustrated in FIG. 4.

FIG. 5 is a graph showing the simulated waveform of current and an operating of the clock signal control block 50, with responses to the ready signals R0 to R3, for a system as illustrated in FIG. 4. Referring to FIG. 5, section A illustrates that the first to forth ready signals "R0" to "R3" can be sequentially activated. Section B illustrates an operating voltage a of a clock signal control block (see 6 of FIG. 2) that can responds to the first to forth ready signals, and an operating voltage b of the clock signal control block (see 50 of FIG. 4) that can responds to the first to forth ready signals. A section C illustrates graphs of current c and d for the operating voltages a and b.

First, when receiving any one of the activated ready signals "R0" to "R3", the clock signal control block 50 can output a low-level signal. However, if all of the ready signals are deactivated, it can be seen that the clock signal control block 50 can output a high-level signal. In particular, when all of the signals are activated (a section represented by a dotted line), it can be seen that the difference Δi between the current c in the conventional systems and the current d of one embodiment described herein is large. That is, a direct current path is formed in the case of the current c, and thus a large current flows. However, it can be seen that current hardly flows in the case of the current d. Therefore whenever the NMOS transistors N1 to N4 are sequentially activated according to the embodiments herein current flows while the transistors are turned on. However, when the transistors have been turned on, a direct current path is not formed, so that current is not additionally consumed.

Therefore, a circuit block that can make responses at high speed, regardless of the number of input signals activated, with a predetermined delay time, and regardless of fan-in, is described herein. In addition, the bypass unit is provided between the pull-up unit and the pull-down unit so that a direct current path is not formed. Accordingly, the pull-down unit and the pull-up unit can be selectively driven in accordance with input signals. Therefore, it is possible to prevent the direct current path from being always formed from the external power supply voltage to the ground voltage.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An Externally Asynchronous-Internally Clocked (EAIC) system that generates an internal clock signal, the EAIC system comprising:
a clock signal control block including:
a pull-up unit configured to receive first and second input signals used to generate the internal clock signal and be activated in response to the first and second input signals;
a pull-down unit configured to receive the first and second input signals and be activated in response to the first and second input signals; and
a bypass unit that is provided between the pull-up unit and the pull-down unit, and selectively provides a signal path to the pull-down unit when the pull-down unit is activated and a signal path from the pull-up unit when the pull-up unit is activated.

2. The EAIC system of claim 1, wherein the pull-up unit comprises a plurality of PMOS transistors connected in parallel, and provides a high-level output signal in response to the deactivated first and second input signals used to generate the internal clock signal.

3. The EAIC system of claim 1, wherein the pull-down unit comprises a plurality of NMOS transistors connected in parallel, and is configured to provide a low-level output signal in response to the activated first and second input signals used to generate the internal clock signal.

4. The EAIC system of claim 2, wherein the bypass unit comprises a PMOS transistor that has a channel length longer than each of the PMOS transistors of the pull-up unit.

5. The EAIC system of claim 4, wherein a source of the bypass unit is connected to a common drain of the pull-up unit, and
a drain, which is an output terminal of the bypass unit, is connected to a common drain of the pull-down unit.

6. The EAIC system of claim 3, wherein when all of the NMOS transistors of the pull-down unit are activated, the bypass unit does not receive an output signal from the pull-up unit.

7. An Externally Asynchronous-Internally Clocked (EAIC) system that generates an internal clock signal, the EAIC system comprising:
a clock signal control block including:
a pull-down unit configured to receive first and second input signals used to generate the internal clock signal and be activated in response to the first and second input signals;
a bypass unit that is connected to an output terminal of the pull-down unit; and
a pull-up unit configured to receive the first and second input signals and be deactivated so that a signal path from an external power supply voltage to the bypass unit is blocked in response to the first and second input signals when the pull-down unit is activated.

8. The EAIC system of claim 7, wherein the pull-up unit comprises a plurality of PMOS transistors connected in parallel, and is configured to provide a high-level output signal in response to deactivated first and second input signals used to generate the internal clock signal.

9. The EAIC system of claim 7, wherein the pull-down unit comprises a plurality of NMOS transistors connected in parallel, and provides a low-level output signal in response to activated first and second input signals used to generate the internal clock signal.

10. The EAIC system of claim 8, wherein the bypass unit comprises a PMOS transistor that has a channel length longer than each of the PMOS transistors of the pull-up unit.

11. The EAIC system of claim 10, wherein the bypass unit is provided between the pull-up unit and the pull-down unit, a source of the bypass unit is connected to a common drain of the pull-up unit, and a drain, which is an output terminal of the bypass unit, is connected to a common drain of the pull-down unit.

12. An Externally Asynchronous-Internally Clocked (EAIC) system that generates an internal clock signal, the EAIC system comprising:
a pull-up unit that includes a plurality of PMOS transistors activated in response to a plurality of input signals used to generate the internal clock signal, respectively;
a pull-down unit that includes a plurality of NMOS transistors activated in response to the plurality of input signals used to generate the internal clock signal, respectively; and
a bypass unit that is provided between the pull-up unit and the pull-down unit, wherein when all of the input signals used to generate the internal clock signal are activated or deactivated, a current path from the pull-up unit to the pull-down unit is blocked.

13. The EAIC system of claim 12, wherein the pull-up unit is configured to provide a high-level output signal in response to any one of the deactivated input signals used to generate the internal clock signal.

14. The EAIC system of claim 12, wherein the pull-down unit provides a low-level output signal in response to any one of activated input signals used to generate the internal clock signal.

15. The EAIC system of claim 13, wherein the bypass unit comprises a PMOS transistor that has a channel length longer than each of the PMOS transistors of the pull-up unit.

16. An Externally Asynchronous-Internally Clocked (EAIC) system that generates an internal clock signal, the EAIC system comprising:
a clock signal control block including:
a pull-down unit including a plurality of pull-down devices that provides output signals corresponding to a ground voltage level receiving a plurality of input signals for generating the internal clock signal;
a pull-up unit including a plurality of pull-up devices that provides output signal corresponding to an external power supply voltage level receiving the plurality of input signals for generating internal clock signal; and
a bypass unit that is provided between the pull-up unit and the pull-down unit, provides a signal path from an external power supply when the pull-up unit is activated, and blocks a signal path from the ground voltage when the pull-down unit is activated.

17. The EAIC system of claim 16, wherein the pull-up devices comprise a plurality of PMOS transistors connected in parallel.

18. The EAIC system of claim 16, wherein the pull-down devices comprise a plurality of NMOS transistors connected in parallel.

19. The EAIC system of claim 16, wherein the bypass unit includes one PMOS transistor that has a channel length longer than each of the PMOS transistors of the pull-up unit.

20. The EAIC system of claim 16, wherein a source of the bypass unit is connected to a common drain of the pull-up unit, and
a drain, which is an output terminal of the bypass unit, is connected to a common drain of the pull-down unit.

21. An Externally Asynchronous-Internally Clocked (EAIC) system that generates an internal clock signal, the EAIC system comprising:
a clock signal control block including:
a pull-up unit configured to receive first and second input signals used to generate the internal clock signal;
a pull-down unit configured to receive the first and second signals; and
a bypass unit that is provided between output terminals of the pull-up unit and the pull-down unit,
wherein an output signal is outputted from the output terminal of the pull-down unit, and the clock signal control block outputs a high-level output signal when the first and second input signals are deactivated and outputs a low-level signal when one or both of the first and second signals are activated.

22. The EAIC system of claim 21, wherein the pull-up unit comprises first and second PMOS transistors connected in parallel, the first PMOS transistor provides a high-level output signal in response to the first input signal and the second PMOS transistor provides the high-level output signal in response to the second input signal.

23. The EAIC system of claim 21, wherein the pull-down unit comprises first and second NMOS transistor connected in parallel, the first NMOS transistor provides a low-level output signal in response to the first input signal and the second NMOS transistor provides the low-level output signal in response to the second input signal.

24. The EAIC system of claim 22, wherein the bypass unit comprises a PMOS transistor that has a channel length longer than each of the PMOS transistors of the pull-up unit and the PMOS transistor of the bypass unit has a gate receiving a ground voltage, a source and a drain, and one of the source and the drain is connected with the output terminal of the pull-up unit and the other is connected with the output terminal of the pull-down unit.

* * * * *